(12) United States Patent
Taguchi et al.

(10) Patent No.: US 9,606,454 B2
(45) Date of Patent: Mar. 28, 2017

(54) SUBSTRATE PROCESSING APPARATUS AND SUBSTRATE PROCESSING SYSTEM

(71) Applicants: Takashi Taguchi, Kyoto (JP); Joji Kuwahara, Kyoto (JP)

(72) Inventors: Takashi Taguchi, Kyoto (JP); Joji Kuwahara, Kyoto (JP)

(73) Assignee: SCREEN Semiconductor Solutions Co., Ltd. (JP)

( * ) Notice: Subject to any disclaimer, the term of this patent is extended or adjusted under 35 U.S.C. 154(b) by 228 days.

(21) Appl. No.: 14/022,657

(22) Filed: Sep. 10, 2013

(65) Prior Publication Data

US 2014/0071423 A1  Mar. 13, 2014

(30) Foreign Application Priority Data

Sep. 13, 2012 (JP) ................. 2012-202019

(51) Int. Cl.
 *G03B 27/42* (2006.01)
 *G03F 7/20* (2006.01)
(52) U.S. Cl.
 CPC ...... *G03F 7/70691* (2013.01); *G03F 7/70733* (2013.01)
(58) Field of Classification Search
 CPC ......... H01L 21/67207; H01L 21/67225; H01L 21/0274; H01L 21/68707; H01L 21/00; H01L 21/3105; H01L 21/67167; H01L 21/67173; H01L 21/67178; H01L 21/6719; H01L 21/67201; H01L 21/67703; H01L 21/67736; H01L 21/67745; H01L 21/67748; H01L 21/6775
 See application file for complete search history.

(56) References Cited

U.S. PATENT DOCUMENTS

| 5,963,753 | A  | * | 10/1999 | Ohtani et al. | 396/611 |
| 6,239,859 | B1 |   | 5/2001  | Park          | 355/27  |
| 6,436,609 | B1 |   | 8/2002  | Park          | 430/313 |
| 6,466,300 | B1 | * | 10/2002 | Deguchi       | 355/27  |
| 2003/0213431 | A1 | | 11/2003 | Fukutomi et al. | 118/696 |
| 2007/0280680 | A1 | | 12/2007 | Kim et al.    | 396/564 |

(Continued)

FOREIGN PATENT DOCUMENTS

| JP | 11-74191    | 3/1999  |
| JP | 2003-324139 | 11/2003 |

(Continued)

OTHER PUBLICATIONS

Notice of Reasons for Refusal dated May 24, 2016 in corresponding JP Patent Application No. 2012-202019.

*Primary Examiner* — Mesfin Asfaw
(74) *Attorney, Agent, or Firm* — Ostrolenk Faber LLP

(57) ABSTRACT

A substrate processing apparatus includes a processing section and an exposure transport section. The exposure transport section includes a horizontal transport region and a plurality of vertical transport regions in a casing. The horizontal transport region is provided at the upper portion of the casing to extend in the X direction. A plurality of exposure devices are arranged below the horizontal transport region to be lined up in the X direction. A transport mechanism is provided in the horizontal transport region. The transport mechanism is configured to be capable of transporting a substrate between the processing section and the plurality of exposure devices.

10 Claims, 11 Drawing Sheets

(56) References Cited

U.S. PATENT DOCUMENTS

| | | | |
|---|---|---|---|
| 2012/0175527 A1 | 7/2012 | De Boer et al. | 250/453.11 |
| 2013/0034421 A1 | 2/2013 | Kuiper et al. | 414/805 |
| 2013/0044305 A1 | 2/2013 | Kuiper et al. | 355/72 |
| 2016/0004173 A1 | 1/2016 | Kuiper et al. | |

FOREIGN PATENT DOCUMENTS

| | | |
|---|---|---|
| JP | 2007-180180 | 7/2007 |
| JP | 2007-324562 | 12/2007 |
| JP | 2010-010430 | 1/2010 |
| WO | WO 2012/080278 A1 | 6/2012 |

* cited by examiner

FIG. 10
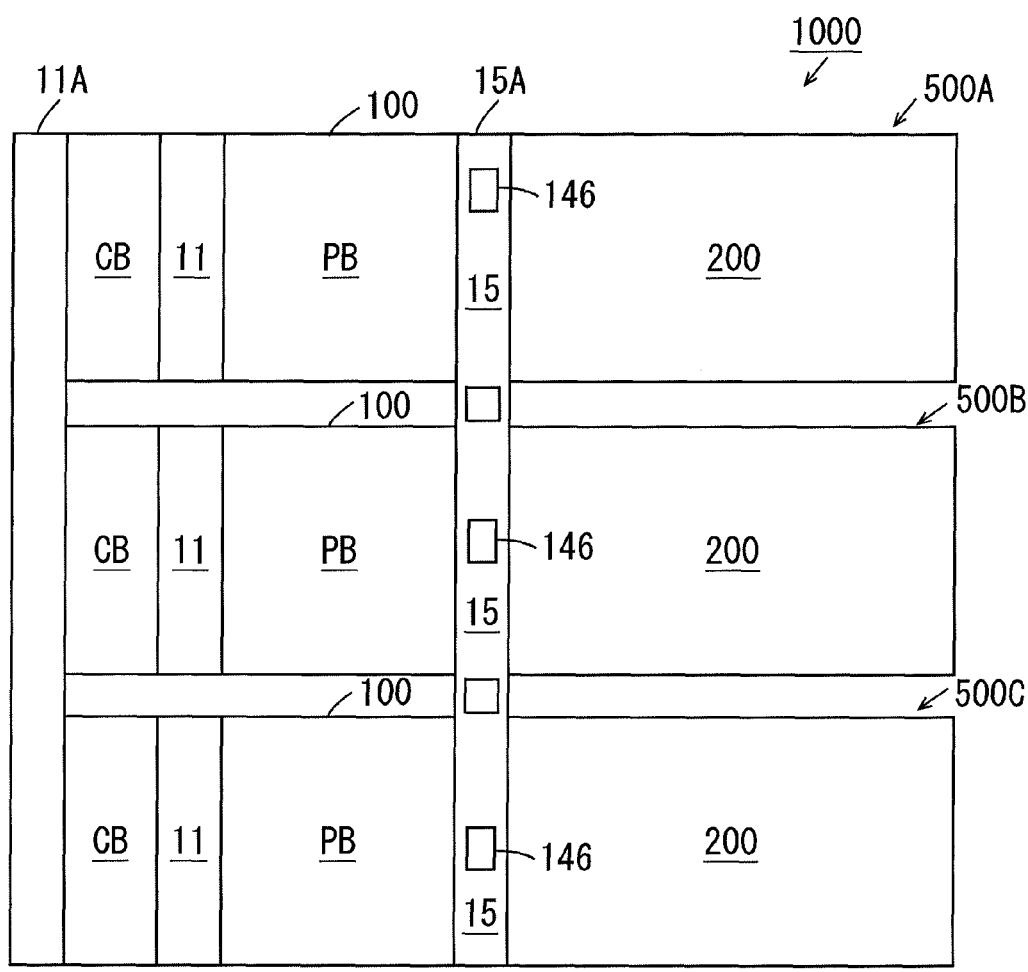
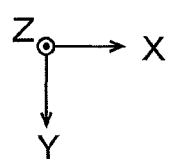

SUBSTRATE PROCESSING APPARATUS AND SUBSTRATE PROCESSING SYSTEM

BACKGROUND OF THE INVENTION

Field of the Invention

The present invention relates to a substrate processing apparatus and a substrate processing system.

Description of Related Art

A substrate processing apparatus is used to apply a variety of processing to substrates such as semiconductor substrates, substrates for use in liquid crystal displays, plasma displays, optical discs, magnetic discs, magneto-optical discs, photomasks, and other substrates.

A substrate processing apparatus described in JP 2003-324139 A is arranged to be adjacent to an exposure device that is an external device. In the substrate processing apparatus, a plurality of processing that includes film formation processing is performed on a substrate before exposure processing, and a plurality of processing that includes development processing is performed on the substrate after the exposure processing.

BRIEF SUMMARY OF THE INVENTION

In the exposure device, direct writing exposure processing by an electron beam is performed on the substrate, for example. In this case, a time period required for the exposure processing for a single substrate is lengthened. When the substrate processing apparatus as described above is used together with such an exposure device, the processing speed in the entire substrate processing apparatus and the exposure device is limited by the processing speed in the exposure device. Thus, throughput in the entire substrate processing apparatus and the exposure device is reduced.

An object of the present invention is to provide a substrate processing apparatus and a substrate processing system in which throughput in a series of substrate processing that includes exposure processing can be improved.

(1) According to one aspect of the present invention, a substrate processing apparatus provided to be adjacent to a plurality of exposure devices, the plurality of exposure devices being arranged in one direction, the substrate processing apparatus includes a processing section that performs processing on a substrate, an exposure transport section for transporting the substrate between the processing section and the plurality of exposure devices, wherein the exposure transport section includes a first transport path provided to extend in the one direction along the plurality of exposure devices, and a first transport mechanism configured to transport the substrate in the first transport path such that the substrate can be received from and transferred to the plurality of exposure devices and the substrate can be received from and transferred to the processing section.

In the substrate processing apparatus, the processing is performed on the substrate in the processing section, and the substrate is transported between the processing section and the plurality of exposure devices via the exposure transport section. The plurality of exposure devices are arranged to be lined up in the one direction. In the exposure transport section, the first transport path extends in the one direction described above, and the first transport mechanism transports the substrate in the first transport path.

In this case, the substrates before the exposure processing can be sequentially transported from the processing section to the plurality of exposure devices. Further, the substrates after the exposure processing can be sequentially transported from the plurality of exposure devices to the processing section. Therefore, the exposure processing can be successively concurrently performed in the plurality of exposure devices. Thus, even if a time period required for the exposure processing in each exposure device is lengthened, the plurality of substrates can be efficiently processed in the substrate processing apparatus and the plurality of exposure devices. Therefore, throughput in a series of substrate processing that includes the exposure processing can be improved.

(2) The processing section may include a processing region that performs processing on the substrate, and a transport region provided between the processing region and the exposure transport section, and the transport region may include a second transport mechanism that transports the substrate between the processing region and the exposure transport section.

In this case, the substrates can be efficiently received and transferred between the processing section and the exposure transport section.

(3) The first transport path may be provided above the plurality of exposure devices. In this case, a size of the occupied area for the exposure transport section can be reduced.

(4) The exposure transport section may include a first interface section, for receiving the substrate from and transferring the substrate to the processing section, provided at one end of the first transport path, and a plurality of second interface sections, for receiving the substrate from and transferring the substrate to the plurality of exposure devices, arranged along the first transport path, and the first transport mechanism may include a mover configured to be movable in the one direction and transporting the substrate between the first interface section and the plurality of second interface section.

In this case, the substrates before the exposure processing are sequentially transported from the first interface section to the plurality of second interface sections by the mover, and the substrates after the exposure processing are sequentially transported from the plurality of second interface sections to the first interface section by the mover. Thus, the substrates can be smoothly transported between the processing section and the plurality of exposure devices. Therefore, throughput in a series of substrate processing that includes the exposure processing can be improved.

(5) The first interface section may include an orientation adjustor for adjusting an orientation of the substrate. In this case, the first transport mechanism can transport each substrate positioned in a constant orientation. Thus, each substrate can be carried into the exposure device while being positioned in an appropriate orientation. As a result, the exposure processing can be appropriately performed on the substrate in the exposure device.

(6) The plurality of exposure devices may be arranged to form a plurality of rows in the one direction, the plurality of first transport paths may be provided to respectively extend along the plurality of rows, and the plurality of first transport mechanisms may be provided to respectively transport the substrates in the plurality of first transport paths.

In this case, the substrates can be concurrently transported in the plurality of first transport paths, and the exposure processing for the substrates can be concurrently performed in the plurality of exposure devices that form a plurality of rows. Thus, throughput in a series of substrate processing that includes the exposure processing can be further improved.

(7) According to another aspect of the present invention, a substrate processing system includes the plurality of substrate processing apparatuses according to the one aspect of the present invention, and a transport section between apparatuses for transporting a substrate among the plurality of substrate processing apparatuses.

This substrate processing system includes the plurality of substrate processing apparatuses according to the one aspect of the present invention, whereby throughput in a series of substrate processing that includes the exposure processing can be improved. Further, because the substrates are transported among the plurality of substrate processing apparatuses by the transport section between apparatuses, the substrates can be processed complimentarily among the plurality of substrate processing apparatuses. Therefore, processing efficiency for the substrates is further improved.

(8) The transport section between apparatuses may be configured to transport the substrate between the exposure transport sections of the plurality of substrate processing apparatuses and the processing sections of the plurality of substrate processing apparatuses.

In this case, a transport route of the substrates can be appropriately changed among the plurality of substrate processing apparatuses. Thus, processing efficiency for the substrates can be improved.

(9) Each substrate processing apparatus may include a carry-in/carry-out region for carrying in the substrate from outside and carrying out the substrate to the outside, and the transport section between apparatuses may be configured to transport the substrate among the carry-in/carry-out regions in the plurality of substrate processing apparatuses.

In this case, a transport route of the substrates can be appropriately changed among the plurality of substrate processing apparatuses. Thus, processing efficiency for the substrates can be improved.

The present invention enables throughput in a series of the substrate processing that includes the exposure processing to be improved.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 10 is a schematic plan view of the substrate processing system according to a third embodiment of the present invention.

DESCRIPTION OF THE PREFERRED EMBODIMENTS

A substrate processing apparatus and a substrate processing system according to embodiments of the present invention will be described with reference to the drawings. In the following description, a substrate refers to a semiconductor substrate, a substrate for a liquid crystal display, a substrate for a plasma display, a glass substrate for a photomask, a substrate for an optical disk, a substrate for a magnetic disk, a substrate for a magneto-optical disk, a substrate for a photomask and the like.

(1) First Embodiment (1-1) Configuration of Substrate Processing Apparatus

Figure 1:
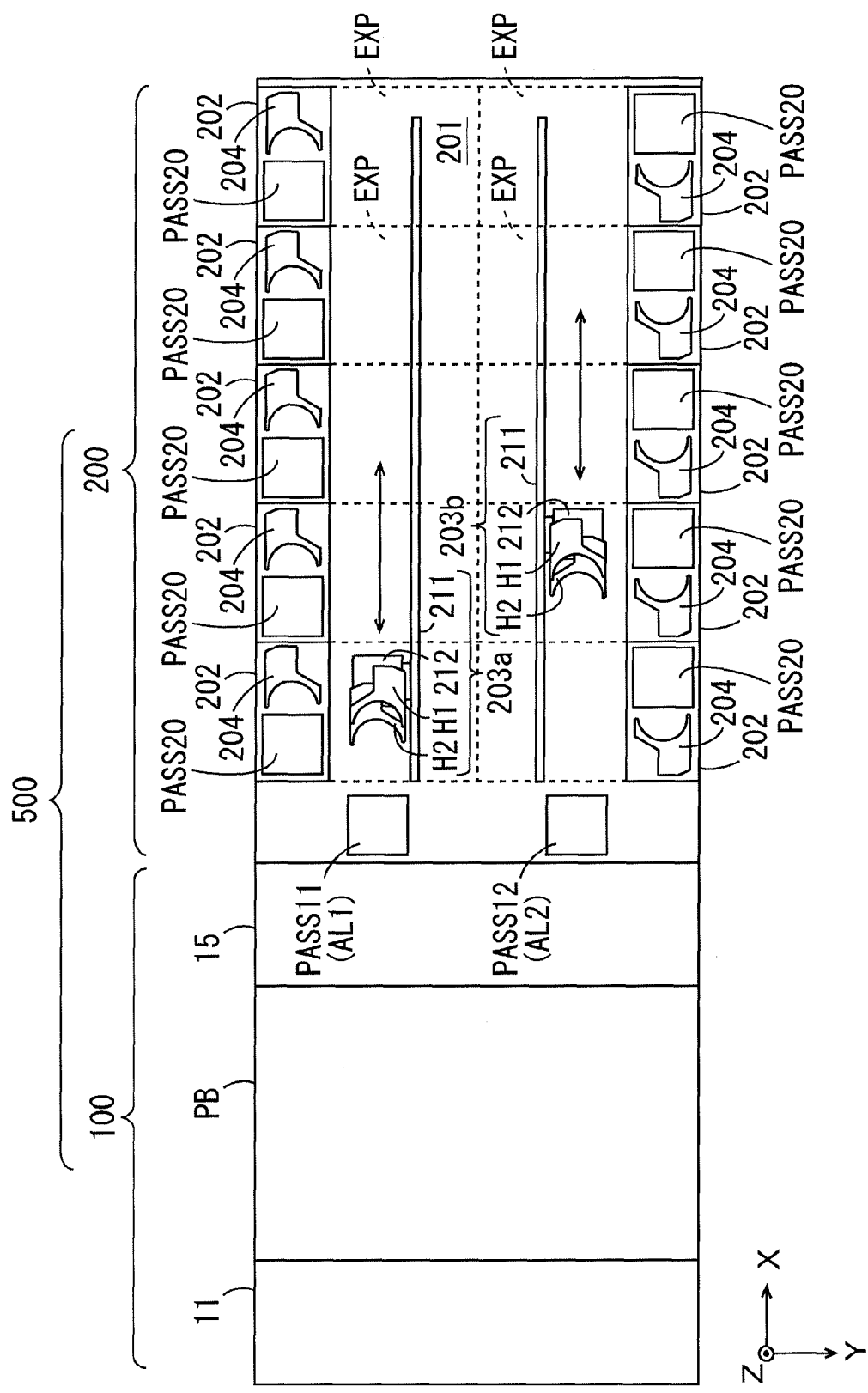
FIG. 1 is a schematic plan view of a substrate processing apparatus according to a first embodiment of the present invention.

FIG. 1 is a schematic plan view of a substrate processing apparatus according to the first embodiment of the present invention. FIG. 1 and subsequent given diagrams are accompanied by the arrows that indicate X, Y, and Z directions orthogonal to one another for clarity of a positional relationship as needed. The X and Y directions are orthogonal to each other within a horizontal plane and the Z direction corresponds to a vertical direction.

As shown in FIG. 1, the substrate processing apparatus 500 includes a processing section 100 and an exposure transport section 200. The processing section 100 includes an indexer block 11, a processing block PB and an interface block 15. Details of the processing section 100 will be described below. The exposure transport section 200 is arranged to be adjacent to the interface block 15 in the processing section 100.

(1-2) Configuration of Exposure Transport Section

Figure 2:
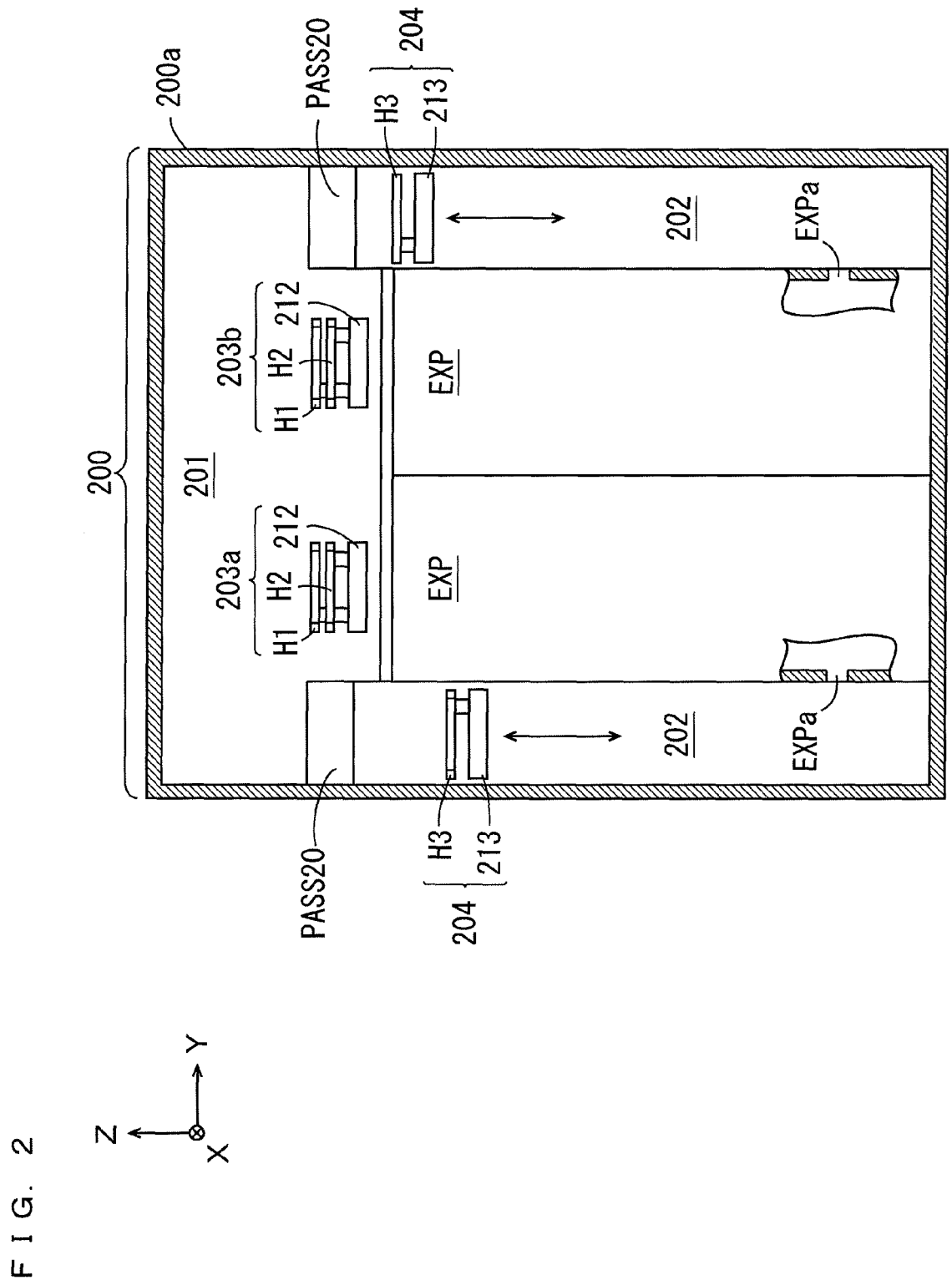
FIG. 2 is a schematic side view of an exposure transport section.
Figure 3:
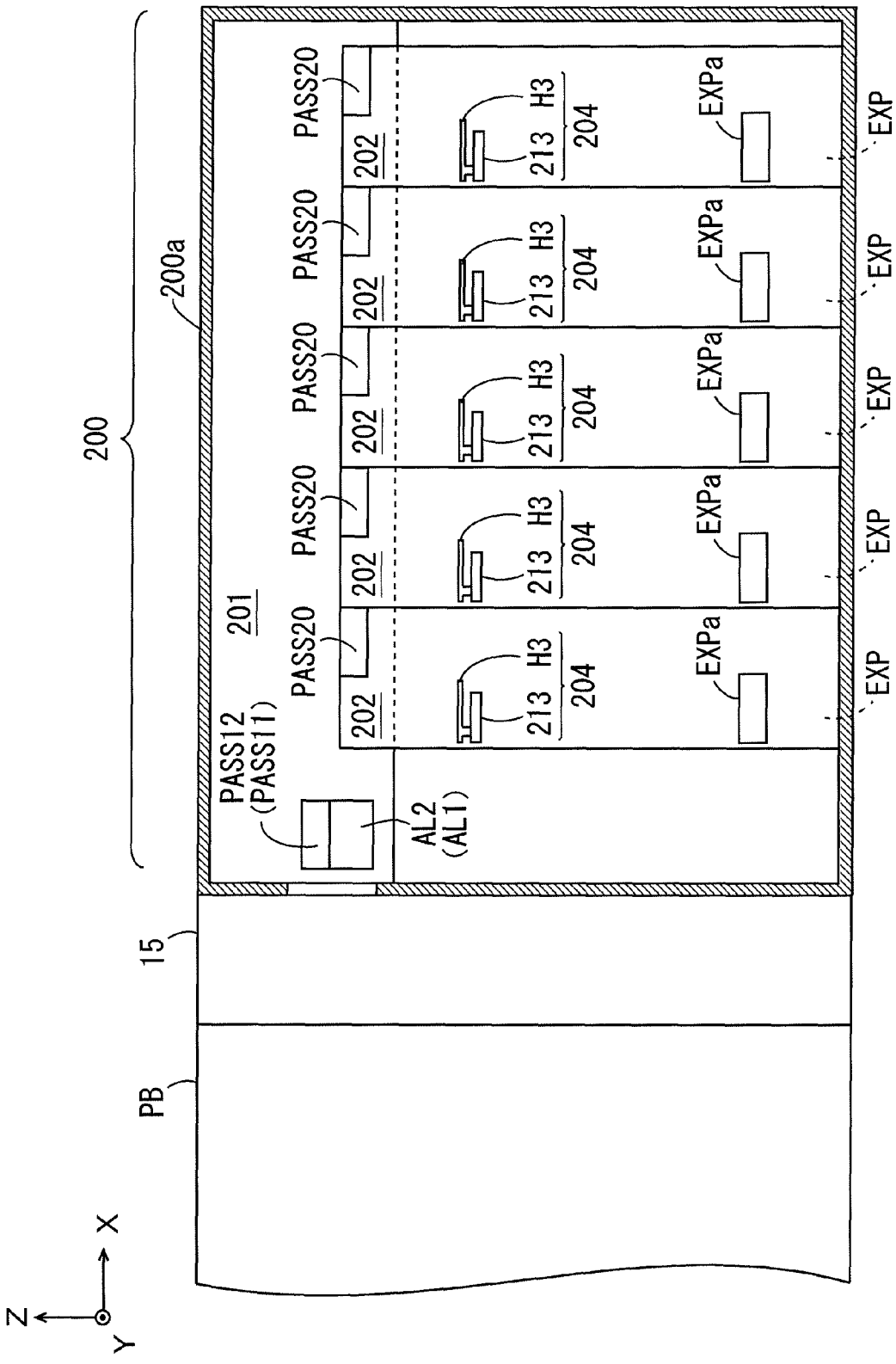
FIG. 3 is a schematic side view of the exposure transport section.

FIGS. 2 and 3 are schematic side views of the exposure transport section 200. As shown in FIGS. 1 to 3, the exposure transport section 200 includes a horizontal transport region 201 and a plurality of vertical transport regions 202 in a casing 200a. The horizontal transport region 201 is provided at an upper portion of the casing 200a to extend in the X direction. A plurality (ten in this example) of exposure devices EXP are arranged below the horizontal transport region 201 to be lined up in two rows in the X direction. Each exposure device EXP performs direct writing exposure processing to the substrate by an electron beam.

The plurality of vertical transport regions 202 are provided in two rows in the X direction on both sides in the casing 200a to be respectively adjacent to the plurality of exposure devices EXP. Each vertical transport region 202 corresponds to the adjacent exposure device EXP. Hereinafter, each of the plurality of vertical transport regions 202 provided on one side (upper side in FIG. 1) in the casing 200a is referred to as the vertical transport region 202 on the one side, and each of the plurality of vertical transport regions 202 provided on the other side (lower side in FIG. 1) in the exposure transport section 200 is referred to as the vertical transport region 202 on the other side.

As shown in FIG. 1, the horizontal transport region 201 is provided with substrate platforms PASS11, PASS12, aligners AL1, AL2 and transport mechanisms 203a, 203b. The substrate platforms PASS11, PASS12 are provided to be adjacent to the interface block 15 in the processing section 100 and to be arranged in the Y direction at one end of the horizontal transport region 201. The aligner AL1 is provided below the substrate platform PASS11, and the aligner AL2 is provided below the substrate platform PASS12. The aligners AL1, AL2 adjust an orientation of the substrate before exposure processing. Here, the orientation of the substrate refers to the position of the substrate in a rotation direction in which an axis in the Z direction is used as a center. Details of the aligners AL1, AL2 will be described below.

The transport mechanism 203a is provided to be adjacent to the plurality of vertical transport region 202 on the one side, and the transport mechanism 203b is provided to be adjacent to the plurality of vertical transport regions 202 on the other side. Each of the transport mechanisms 203a, 203b includes a guide rail 211, a moving rotator 212 and hands H1, H2. The guide rail 211 is provided to linearly extend in the X direction. The moving rotator 212 is configured to be movable in the X direction along each guide rail 211 and rotatable around an axis in the vertical direction (Z direction). The hands H1, H2 for holding the substrates are attached one above the other at the moving rotator 212. The hands H1, H2 are configured to be capable of advancing and retreating in the horizontal direction with respect to the moving rotator 212. Each guide rail 211 is lifted and lowered in the vertical direction by a lifting/lowering mechanism (not shown). Thus, the moving rotator 212 and the hands H1, H2 are integrally lifted and lowered in the vertical direction.

In each vertical transport region 202, a substrate platform PASS20 and a transport mechanism 204 are provided. As shown in FIGS. 2 and 3, each substrate platform PASS20 is provided at a position higher than the bottom surface of the horizontal transport region 201. Each transport mechanism 204 has a moving rotator 213 and a hand H3. Each moving rotator 213 is configured to be movable in the vertical direction and rotatable around an axis in the vertical direction (Z direction). The hand H3 is configured to be capable of advancing and retreating in the horizontal direction with respect to the moving rotator 212. An opening EXPa is provided at a lower portion of the outer side surface of each exposure device EXP. Each transport mechanism 204 is configured to be capable of transporting the substrate between the substrate platform PASS20 and the exposure device EXP through the opening EXPa.

In the horizontal transport region 201, the transport mechanism 203a is configured to be capable of transporting the substrates among the substrate platform PASS11, the aligner AL1 and the substrate platforms PASS20 in the plurality of vertical transport regions 202 on the one side. The transport mechanism 203b is configured to be capable of transporting the substrates among the substrate platform PASS12, the aligner AL2 and the substrate platforms PASS20 in the plurality of vertical transport regions 202 on the other side.

(1-3) Operation of Exposure Transport Section

The operation of the exposure transport section 200 will be described with reference to FIGS. 1 to 3. The substrates after resist film formation and before the exposure processing are transported from the interface block 15 in the processing section 100 (FIG. 1) to the aligners AL1, AL2 in the exposure transport section 200. In each of the aligners AL1, AL2, the orientation of the substrate is adjusted as described below.

The transport mechanism 203a sequentially transports the substrates before the exposure processing from the aligner AL1 to the substrate platforms PASS20 in the plurality of vertical transport regions 202 on the one side using one of the hands H1, H2. The transport mechanism 203b sequentially transports the substrates before the exposure processing from the aligner AL2 to the substrate platforms PASS20 in the plurality of vertical transport regions 202 on the other side using one of the hands H1, H2.

In each of the plurality of vertical transport regions 202 on the one side and the plurality of vertical transport regions 202 on the other side, the transport mechanism 204 transports the substrate before the exposure processing from the substrate platform PASS20 to the exposure device EXP. After the exposure processing for the substrate is performed in the exposure device EXP, the transport mechanism 204 transports the substrate after the exposure processing from the exposure device EXP to the substrate platform PASS20.

The transport mechanism 203a sequentially transports the substrates after the exposure processing from the substrate platforms PASS20 in the plurality of vertical transport regions 202 on the one side to the substrate platform PASS11 using the other one of the hands H1, H2. The transport mechanism 203b sequentially transports the substrates after the exposure processing from the substrate platforms PASS20 in the plurality of vertical transport regions 202 on the other side to the substrate platform PASS12 using the other one of the hands H1, H2.

The transport mechanism 203a successively places the substrates on the substrate platform PASS11 and receives the substrates from the aligner AL1. The moving rotator 212 is moved to a position in close proximity to the substrate platform PASS11 and the aligner AL1 while the substrate after the exposure processing is held by the hand H2, for example. Subsequently, the substrate after the exposure processing held by the hand H2 is placed on the substrate platform PASS11, and the substrate before the exposure processing is received from the aligner ALA by the hand H1.

Further, the transport mechanism 203a successively receives the substrates from the substrate platforms PASS20 and places the substrates on the substrate platforms PASS20. The moving rotator 212 is moved to a position in close proximity to the substrate platform PASS20 on which the substrate after the exposure processing is placed while the substrate before the exposure processing is held by the hand H1, for example. Subsequently, the substrate after the exposure processing is received from the substrate platform PASS20 by the hand H2, and the substrate before the exposure processing held by the hand H1 is placed on the substrate platform PASS20. When the substrate is not placed on the substrate platform PASS20 in any of the vertical transport regions 202 on the one side, the transport mechanism 203a waits until the substrate is placed on any one of the substrate platforms PASS20.

Similarly, the transport mechanism 203b successively places the substrates after the exposure processing on the substrate platforms PASS12 and receives the substrates before the exposure processing from the aligner AL2, and successively receives the substrates after the exposure processing from the substrate platforms PASS20 and places the substrates before the exposure processing on the substrate platforms PASS20.

The transport mechanisms 203a, 203b repeat the operation described above such that the substrates before the exposure processing and the substrates after the exposure processing are sequentially interchanged in each of the plurality of vertical transport regions 202 on the one side and the plurality of vertical transport regions 202 on the other side. Thus, the exposure processing for the substrates can be successively and concurrently performed in the plurality of exposure devices EXP.

When processing for one lot of the substrates is started, for example, the transport mechanisms 203a, 203b only transport the substrates before the exposure processing until the substrates are carried into all of the exposure devices EXP. Thereafter, each of the transport mechanisms 203a, 203b sequentially interchanges the substrate after the exposure processing and the substrate before the exposure processing as described above every time the exposure processing is completed in each exposure device EXP.

(1-4) Configuration of Aligner

Figure 4:
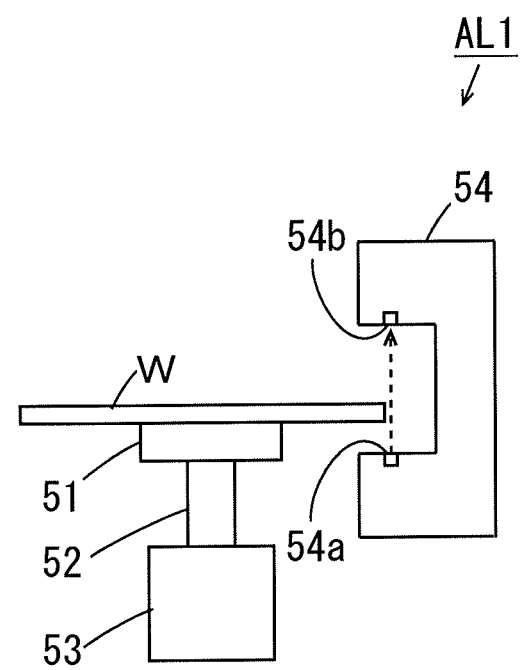
FIG. 4(a) is a schematic side view showing the configuration of an aligner.
FIG. 4(b) is a schematic plan view.
Figure 4:
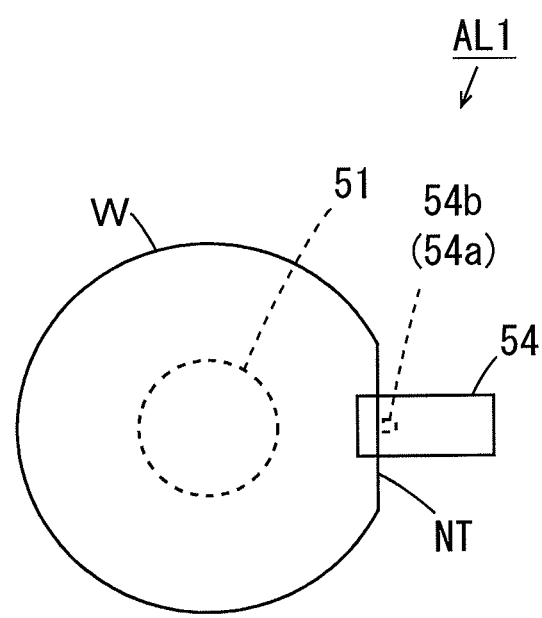

FIGS. 4(a) and 4(b) are a schematic side view and a schematic plan view showing the configuration of the aligner AL1. The aligner AL2 of FIG. 3 has the similar configuration to the aligner AL1 of FIGS. 4(a) and 4(b).

As shown in FIG. 4(a), the aligner AL1 includes a spin chuck 51, a connection shaft 52, a motor 53 and a notch detector 54. The spin chuck 51 is connected to the motor 53 via the connection shaft 52. The spin chuck 51 sucks the back surface of the substrate W under vacuum and horizontally holds the substrate W. Here, the back surface of the substrate W refers to a surface opposite to the surface of the substrate W on which a resist film is formed. The spin chuck 51 is rotated by the motor 53 such that the substrate W held by the spin chuck 51 is rotated around an axis in the vertical direction (Z direction).

The notch detector 54 includes a light projector 54a and a light receiver 54b arranged to be spaced apart from each other in the vertical direction. The peripheral edge of the substrate W held by the spin chuck 51 is arranged between the light projector 54a and the light receiver 54b of the notch detector 54. In this state, the substrate W is rotated.

As shown in FIG. 4(b), a notch (cutout) NT for detecting the orientation of the substrate W is formed at part of the peripheral edge of the substrate W. When a portion of the peripheral edge of the substrate W except for the notch NT is positioned between the light projector 54a and the light receiver 54b of the notch detector 54, the light projected from the light projector 54a is shielded by the peripheral edge of the substrate W, thereby not being received by the light receiver 54b. On the other hand, when the notch NT is positioned between the light projector 54a and the light receiver 54b, the light projected from the light projector 54a is received by the light receiver 54b. Thus, the notch NT of the substrate W can be detected.

The orientation of the substrate W is adjusted such that the notch NT is positioned in a predetermined direction with respect to the center of the substrate W in each of the aligners AL1, AL2. Thereafter, the substrate W is held by the transport mechanisms 203a, 203b and taken out from the aligners AL1, AL2. In this case, the orientation of all of the substrates W transported by the transport mechanism 203a is the same, and those substrates W are carried into the exposure devices EXP via the vertical transport regions 202 on the one side while being positioned in the same orientation. Further, the orientation of all of the substrates W transported by the transport mechanism 203b is the same, and those substrates W are carried into the exposure devices EXP via the vertical transport regions 202 on the other side while being positioned in the same orientation. Thus, in each exposure device EXP, the exposure processing can be performed on each substrate W while the orientation of the substrate W is appropriate.

(1-5) Configuration of Processing Section

Figure 5:
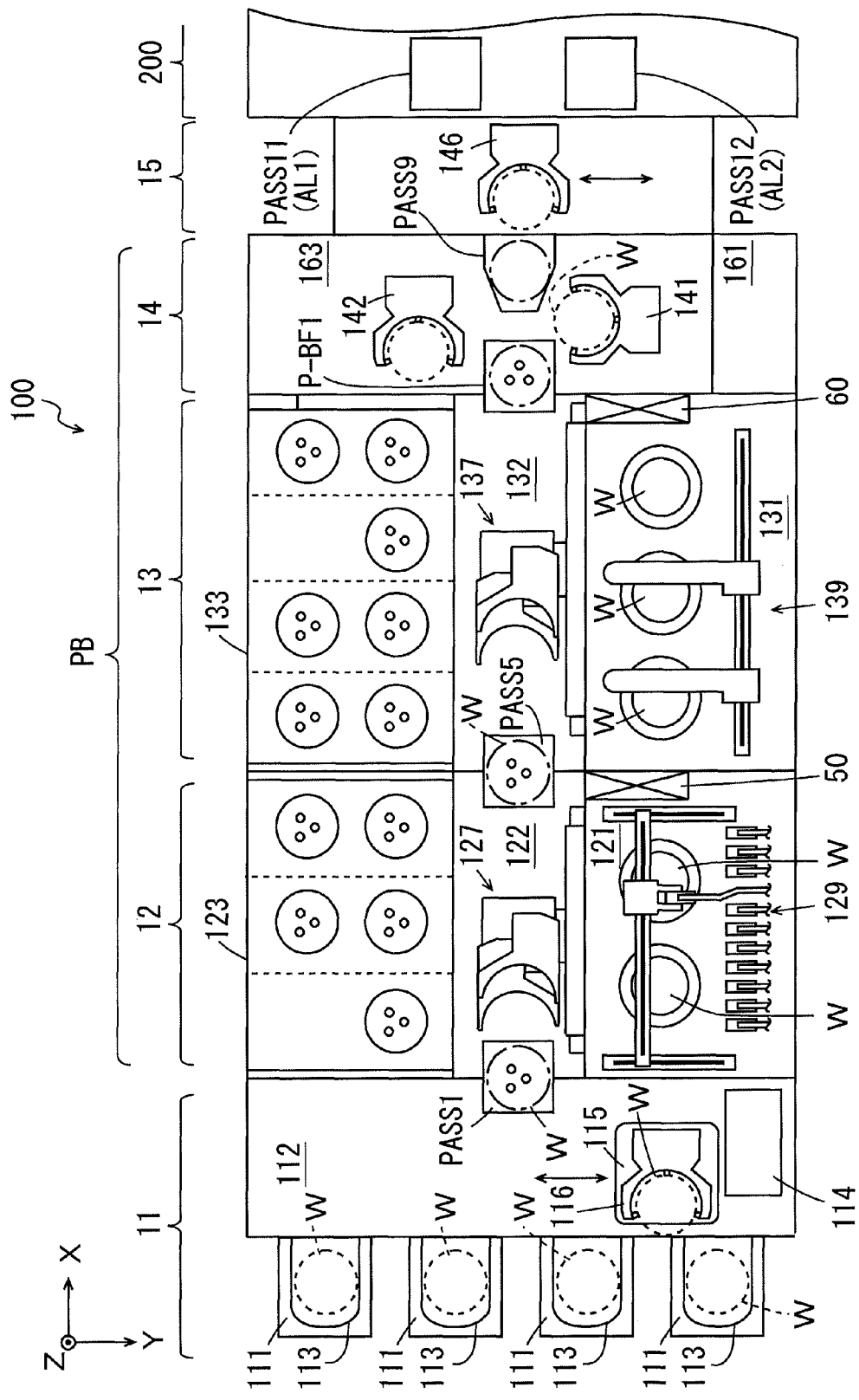
FIG. 5 is a schematic plan view showing the configuration of a processing section.

FIG. 5 is a schematic plan view showing the configuration of the processing section 100. As shown in FIG. 5, the processing section 100 includes the indexer block 11, a first processing block 12, a second processing block 13, a back surface cleaning processing block 14 and the interface block 15. The processing block PB is constituted by the first and second processing blocks 12, 13 and the back surface cleaning processing block 14.

The indexer block 11 includes a plurality of carrier platforms 111 and a transport section 112. A carrier 113 in which the plurality of substrates W are stored in multiple stages is placed on each carrier platform 111.

The transport section 112 is provided with a controller 114 and a transport mechanism 115. The controller 114 controls various constituent elements of the substrate processing apparatus 500. The transport mechanism 115 has a hand 116 for holding the substrate W. The transport mechanism 115 holds and transports the substrate W using the hand 116.

The first processing block 12 includes a coating processing section 121, a transport section 122 and a thermal processing section 123. The coating processing section 121 and the thermal processing section 123 are provided to be opposite to each other with the transport section 122 held therebetween. A substrate platform PASS1 and after-mentioned substrate platforms PASS2 to PASS4 (see FIG. 8) on which the substrates W are placed are provided between the transport section 122 and the indexer block 11. The transport section 122 is provided with a transport mechanism 127 and an after-mentioned transport mechanism 128 (see FIG. 8) that transport the substrates W.

The second processing block 13 includes a development processing section 131, a transport section 132 and a thermal processing section 133. The development processing section 131 and the thermal processing section 133 are provided to be opposite to each other with the transport section 132 held therebetween. A substrate platform PASS5 and after-mentioned substrate platforms PASS6 to PASS8 (see FIG. 8) on which the substrates W are placed are provided between the transport section 132 and the transport section 122. The transport section 132 is provided with a transport mechanism 137 and an after-mentioned transport mechanism 138 (see FIG. 8) that transport the substrates W.

The back surface cleaning processing block 14 includes a back surface cleaning processing section 161 and a transport section 163. The transport section 163 is provided with transport mechanisms 141, 142. A placement/buffer section P-BF1 and an after-mentioned placement/buffer section P-BF2 (see FIG. 8) are provided between the transport section 163 and the transport section 132. The placement/buffer sections P-BF1, P-BF2 are configured to be capable of storing the plurality of substrates W.

Further, a substrate platform PASS9 and after-mentioned placement/cooling platforms P-CP (see FIG. 8) are provided between the transport mechanisms 141, 142 to be adjacent to the interface block 15. Each placement/cooling platform P-CP includes a function of cooling the substrate W. In the placement/cooling platform P-CP, the substrate W is cooled to a temperature suitable for the exposure processing.

The interface block 15 is provided with a transport mechanism 146. The transport mechanism 146 transports the substrates W before the exposure processing to the aligners AL1, AL2 in the exposure transport section 200, and receives the substrates W after the exposure processing from the substrate platforms PASS11, PASS12 in the exposure transport section 200.

Figure 6:
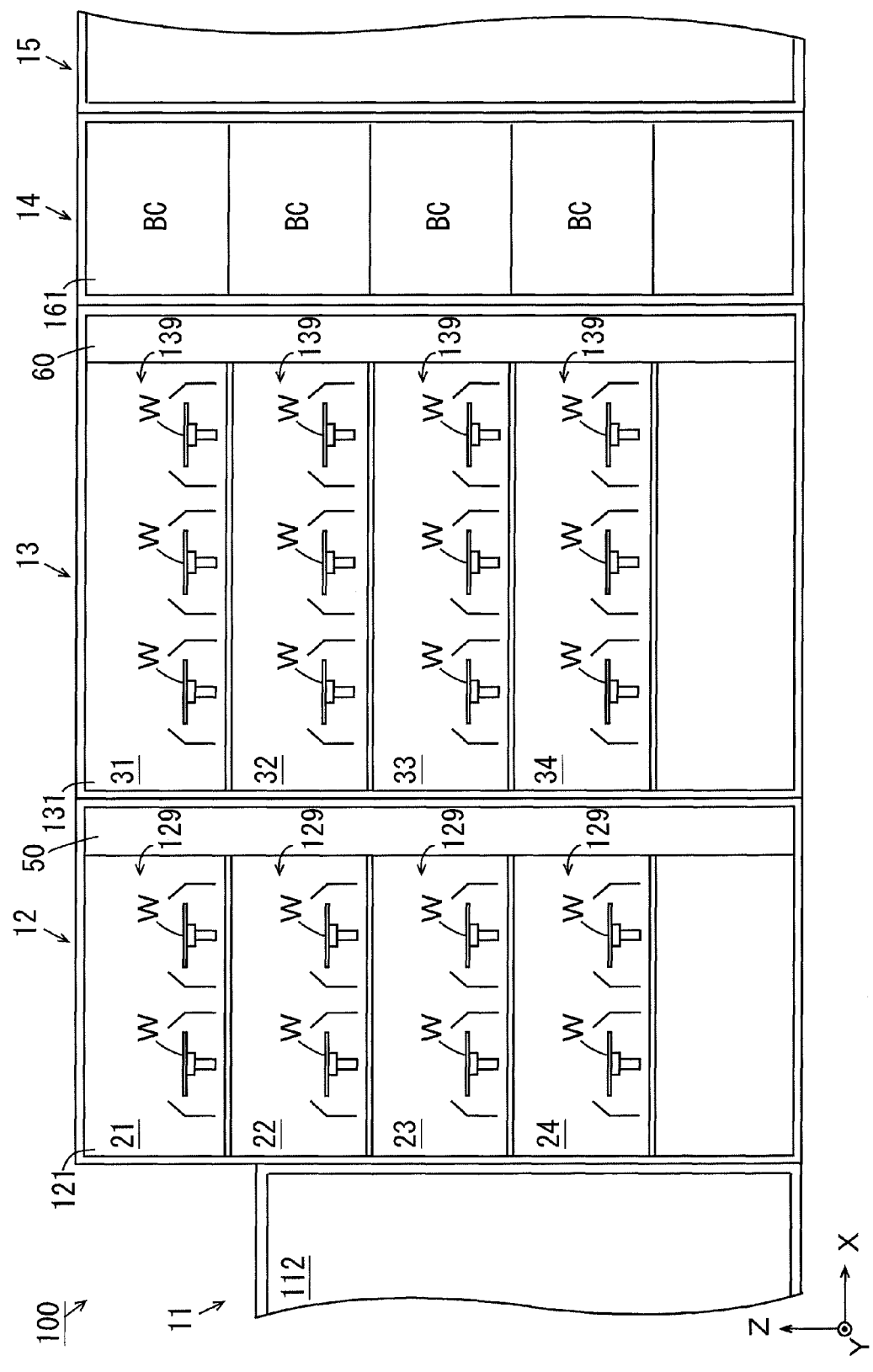
FIG. 6 is a schematic side view of the processing section mainly showing a coating processing section, a development processing section and a back surface cleaning processing section of FIG. 5.

(1-6) Configuration of Coating Processing Section and Development Processing Section FIG. 6 is a schematic side view of the processing section 100 mainly showing the coating processing section 121, the development processing section 131 and the back surface cleaning processing section 161 of FIG. 5.

As shown in FIG. 6, coating processing chambers 21, 22, 23, 24 are provided in a stack in the coating processing section 121. A coating processing unit 129 is provided in each of the coating processing chambers 21 to 24. Development processing chambers 31, 32, 33, 34 are provided in a stack in the development processing section 131. The development processing unit 139 is provided in each of the development processing chambers 31 to 34.

A processing liquid for a base film is applied to the substrate W in the coating processing unit 129 in the coating processing chamber 22, 24. Thus, the base film is formed on the substrate W. A processing liquid for the resist film is applied to the substrate W in the coating processing unit 129 in the coating processing chamber 21, 23. Thus, the resist film is formed on the substrate W. In the present embodiment, the resist film is formed after the base film is formed on the substrate W such that adhesion of the resist film to the substrate W is increased. Further, when another film is formed on the substrate W before the substrate W is carried into the substrate processing apparatus 100, the resist film is prevented from being influenced by another film. A development liquid is supplied to the substrate W in the development processing unit 139. Thus, the development processing for the substrate W is performed.

A plurality (four in this example) of back surface cleaning processing units BC are provided in the back surface cleaning processing section 161. In the back surface cleaning processing unit BC, cleaning processing for the back surface of the substrate W before the exposure processing is performed using a brush.

As shown in FIGS. 5 and 6, a fluid box 50 is provided in the coating processing section 121 to be adjacent to the development processing section 131. Similarly, a fluid box 60 is provided in the development processing section 131 to be adjacent to the back surface cleaning processing block 14. The fluid box 50 and the fluid box 60 each house fluid related elements such as a pipe, a joint, a valve, a flowmeter, a regulator, a pump and a temperature adjuster used to supply a chemical liquid to the coating processing units 129 and the development processing units 139 and discharge the liquid and air out of the coating processing units 129 and the development processing units 139.

(1-7) Configuration of Thermal Processing Section

Figure 7:
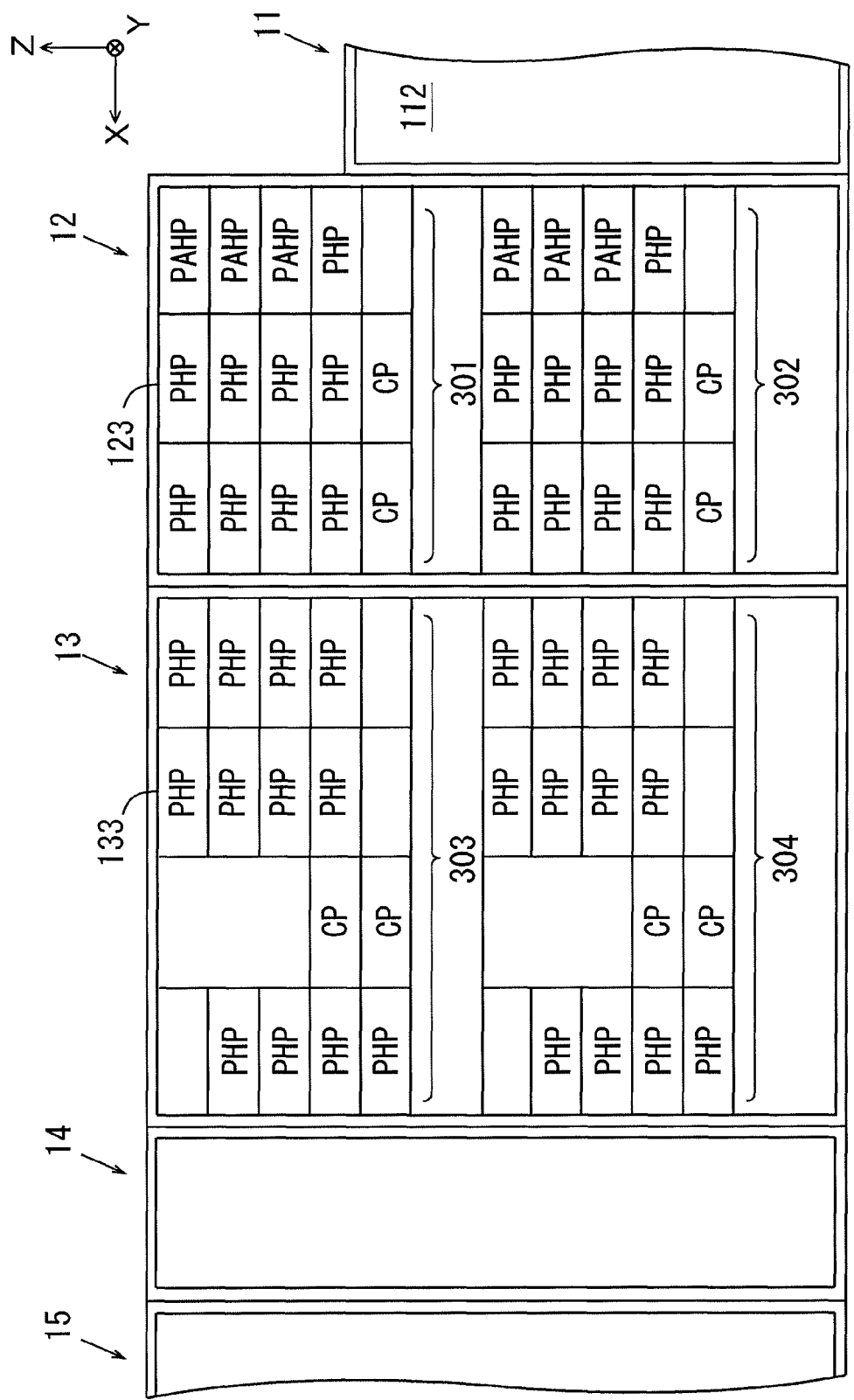
FIG. 7 is a schematic side view of the processing section mainly showing a thermal processing section of FIG. 5.

FIG. 7 is a schematic side view of the processing section 100 mainly showing the thermal processing sections 123, 133 of FIG. 5.

As shown in FIG. 7, the thermal processing section 123 has an upper thermal processing section 301 provided above and a lower thermal processing section 302 provided below. The upper thermal processing section 301 and the lower thermal processing section 302 are provided with a plurality of thermal processing units PHP, a plurality of adhesion reinforcement processing units PAHP and a plurality of cooling units CP.

In each thermal processing unit PHP, heating processing and cooling processing for the substrates W are performed. Hereinafter, the heating processing and the cooling processing performed in the thermal processing units PHP are merely referred to as thermal processing. In each adhesion reinforcement processing unit PAHP, adhesion reinforcement processing for improving adhesion between the substrate W and the base film is performed. Specifically, in the adhesion reinforcement processing unit PAHP, an adhesion agent such as HMDS (hexamethyldisilazane) is applied to the substrate W, and the heating processing is performed on the substrate W. In each cooling unit CP, the cooling processing for the substrate W is performed.

The thermal processing section 133 has an upper thermal processing section 303 provided above and a lower thermal processing section 304 provided below. The upper thermal processing section 303 and the lower thermal processing section 304 are provided with the cooling units CP and the plurality of thermal processing units PHP. In the upper thermal processing section 303 and the lower thermal processing section 304, the thermal processing units PHP provided to be adjacent to the back surface cleaning processing block 14 are configured such that the substrates W can be carried in from the back surface cleaning processing block 14 to the thermal processing units PHP.

(1-8) Configuration of Transport Section

Figure 8:
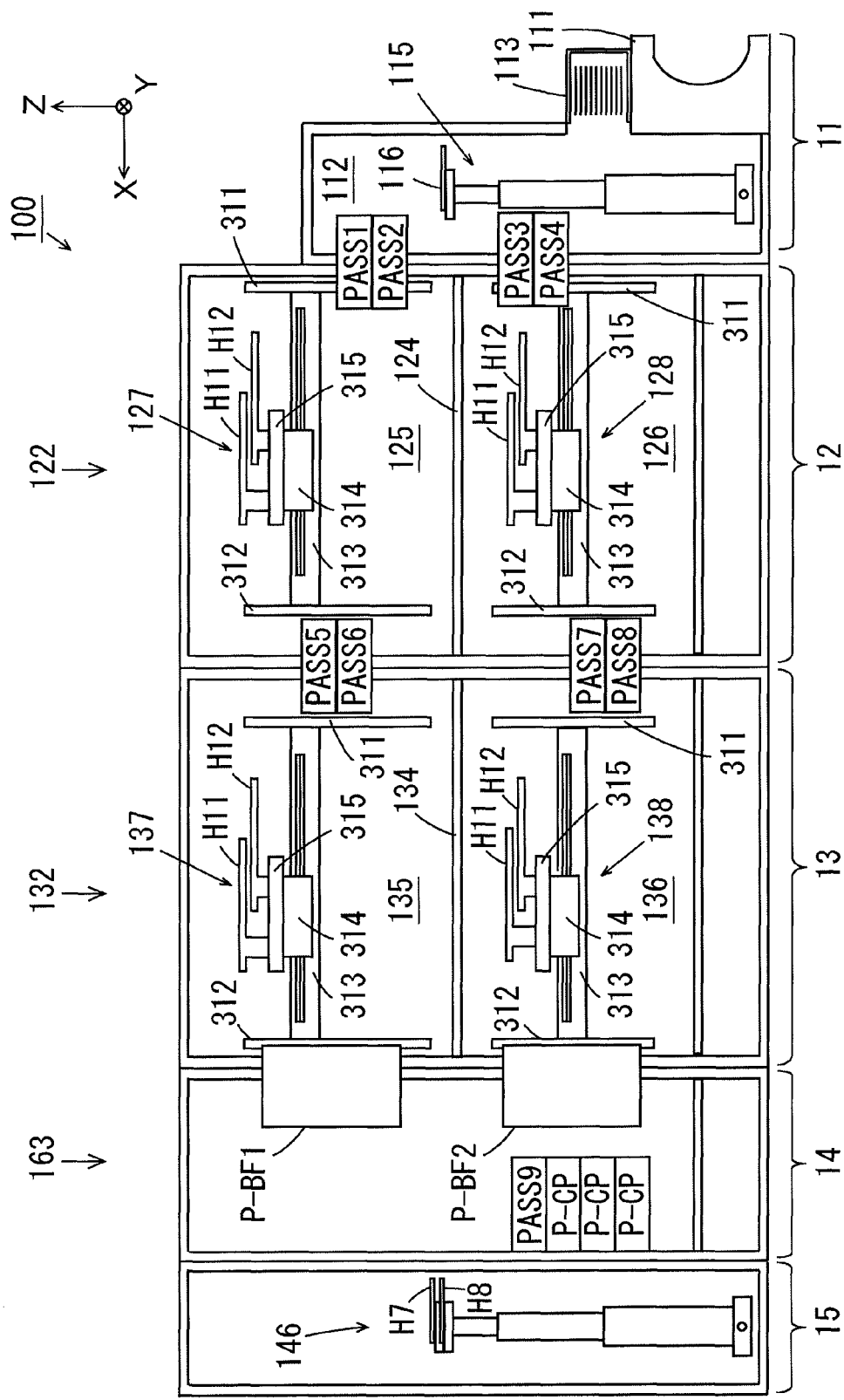
FIG. 8 is a side view mainly showing a transport section of FIGS. 4(a) and 4(b)

FIG. 8 is a side view mainly showing the transport sections 122, 132, 163 of FIG. 5. As shown in FIG. 8, the transport section 122 has an upper transport chamber 125 and a lower transport chamber 126. The transport section 132 has an upper transport chamber 135 and a lower transport chamber 136. The upper transport chamber 125 is provided with the transport mechanism 127, and the lower transport chamber 126 is provided with the transport mechanism 128. Further, the upper transport chamber 135 is provided with the transport mechanism 137, and the lower transport chamber 136 is provided with the transport mechanism 138.

The substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement/buffer section P-BF1 is provided between the upper transport chamber 135 and the transport section 163, and the placement/buffer section P-BF2 is provided between the lower transport chamber 136 and the transport section 163. The substrate platform PASS9 and the plurality of placement/cooling platforms P-CP are provided in the transport section 163 to be adjacent to the interface block 15.

Each of the transport mechanisms 127, 128, 137, 138 includes guide rails 311, 312, 313, a moving member 314, a rotation member 315 and hands H11, H12. The guide rails 311, 312 are provided to extend in the vertical direction, respectively. The guide rail 313 is provided to extend in the horizontal direction (X direction) between the guide rail 311 and the guide rail 312, and is attached to the guide rails 311, 312 to be movable in the vertical direction. Each moving member 314 is attached to the guide rail 313 to be movable in the horizontal direction (X direction). The rotation member 315 is provided on the upper surface of the moving member 314 to be rotatable. The hand H11 and the hand H12 for holding the substrates W are attached to the rotating member 315. The hands H11, H12 are configured to be capable of advancing and retreating in the horizontal direction.

By such a configuration, the moving member 314 is movable in the X direction and the Z direction, and the rotation member 315 is rotatable around an axis in the Z direction. Further, the substrates W can be received and placed using the hands H11, H12.

The transport mechanism 127 is configured to be capable of transporting the substrates W among the substrate platforms PASS1, PASS2, PASS5, PASS6, the coating processing chambers 21, 22 (FIG. 6) and the upper thermal processing section 301 (FIG. 7). The transport mechanism 128 is configured to be capable of transporting the substrates W among the substrate platforms PASS3, PASS4, PASS7, PASS8, the coating processing chambers 23, 24 (FIG. 6) and the lower thermal processing section 302 (FIG. 7).

The transport mechanism 137 is configured to be capable of transporting the substrates W among the substrate platforms PASS5, PASS6, the placement/buffer section P-BF1, the development processing chambers 31, 32 (FIG. 6) and the upper thermal processing section 303 (FIG. 7). The transport mechanism 138 is configured to be capable of transporting the substrates W among the substrate platforms PASS7, PASS8, the placement/buffer section P-BF2, the development processing chambers 33, 34 (FIG. 6) and the lower thermal processing section 304 (FIG. 7).

(1-9) Operation of Processing Section

The operation of the processing section 100 will be described with reference to FIGS. 5 to 8. The carrier 113 in which the unprocessed substrates W are stored is placed on each carrier platform 111 (FIG. 5) in the indexer block 11. The transport mechanism 115 transports the unprocessed substrates W from the carrier 113 to the substrate platforms PASS1, PASS3 (FIG. 8). Further, the transport mechanism 115 transports the processed substrates W placed on the substrate platforms PASS2, PASS4 (FIG. 8) to the carriers 113.

In the first processing block 12, the transport mechanism 127 (FIG. 8) transports the substrate W placed on the substrate platform PASS1 (FIG. 8) to the adhesion reinforcement processing unit PAHP (FIG. 7), the cooling unit CP (FIG. 7), the coating processing chamber 22 (FIG. 6), the thermal processing unit PHP (FIG. 7), the cooling unit CP (FIG. 7), the coating processing chamber 21 (FIG. 6), the thermal processing unit PHP (FIG. 7) and the substrate platform PASS5 (FIG. 8) in this order.

In this case, after the adhesion reinforcement processing is performed on the substrate W in the adhesion reinforcement processing unit PAHP, the substrate W is cooled in the cooling unit CP to a temperature suitable for base film formation. Then, the base film is formed on the substrate W in the coating processing chamber 22 by the coating processing unit 129 (FIG. 6). Subsequently, after the thermal processing for the substrate W is performed in the thermal processing unit PHP, the substrate W is cooled in the cooling unit CP to a temperature suitable for the resist film formation. Next, the resist film is formed on the substrate W in the coating processing chamber 21 by the coating processing unit 129 (FIG. 6). Thereafter, the thermal processing for the substrate W is performed in the thermal processing unit PHP, and the substrate W is placed on the substrate platform PASS5.

Further, the transport mechanism 127 transports the substrate W after the development processing placed on the substrate platform PASS6 (FIG. 8) to the substrate platform PASS2 (FIG. 8).

The transport mechanism 128 (FIG. 8) transports the substrate W placed on the substrate platform PASS3 (FIG. 8) to the adhesion reinforcement processing unit PAHP (FIG. 7), the cooling unit CP (FIG. 7), the coating processing chamber 24 (FIG. 6), the thermal processing unit PHP (FIG. 7), the cooling unit CP (FIG. 7), the coating processing chamber 23 (FIG. 6), the thermal processing unit PHP (FIG. 7) and the substrate platform PASS7 (FIG. 8) in this order.

Further, the transport mechanism 128 (FIG. 8) transports the substrate W after the development processing placed on the substrate platform PASS8 (FIG. 8) to the substrate platform PASS4 (FIG. 8). The order and content of the processing for the substrates W in the coating processing chambers 23, 24 (FIG. 6) and the lower thermal processing section 302 (FIG. 7) are similar to the order and content of the processing for the substrates W in the afore-mentioned coating processing chambers 21, 22 (FIG. 6) and the upper thermal processing section 301 (FIG. 7).

In the second processing block 13, the transport mechanism 137 (FIG. 8) transports the substrate W after the resist film formation placed on the substrate platform PASS5 (FIG. 8) to the placement/buffer section P-BF1 (FIG. 8). Further, the transport mechanism 137 (FIG. 8) takes out the substrate W after the exposure processing and the thermal processing from the thermal processing unit PHP (FIG. 7) adjacent to the back surface cleaning processing block 14, and transports the substrate W to the cooling unit CP (FIG. 7), the development processing chamber 31, 32 (FIG. 6), the thermal processing unit PHP (FIG. 7) and the substrate platform PASS6 (FIG. 8) in this order.

In this case, after the substrate W is cooled in the cooling unit CP to a temperature suitable for the development processing, the development processing for the substrate W is performed by the development processing unit 139 in the development processing chamber 31 or the development processing chamber 32. Thereafter, the thermal processing for the substrate W is performed in the thermal processing unit PHP, and the substrate W is placed on the substrate platform PASS6.

The transport mechanism 138 (FIG. 8) transports the substrate W after the resist film formation placed on the substrate platform PASS7 (FIG. 8) to the placement/buffer section P-BF2 (FIG. 8). Further, the transport mechanism 138 (FIG. 8) takes out the substrate W after the exposure processing and the thermal processing from the thermal processing unit PHP (FIG. 7) adjacent to the back surface cleaning processing block 14 and transports the substrate W to the cooling unit CP (FIG. 7), the development processing chamber 33, 34 (FIG. 6), the thermal processing unit PHP (FIG. 7) and the substrate platform PASS8 (FIG. 8) in this order. The order and content of the processing for the substrates W in the development processing chambers 33, 34 and the lower thermal processing section 304 are similar to the order and content of the processing for the substrates W in the afore-mentioned development processing chambers 31, 32 and the upper thermal processing section 303.

In the back surface cleaning processing block 14, the transport mechanism 141 (FIG. 5) transports the substrate W placed on the placement/buffer section P-BF1, P-BF2 (FIG. 8) to the back surface cleaning processing unit BC (FIG. 6) in the back surface cleaning processing section 161 and the placement/cooling platform P-CP (FIG. 8) in this order. In this case, after the cleaning processing for the back surface of the substrate W is performed in the back surface cleaning processing unit BC, the substrate W is cooled in the placement/cooling platform P-CP to a temperature suitable for the exposure processing in the exposure device EXP (FIGS. 1 to 3).

The transport mechanism 142 (FIG. 5) transports the substrate W after the exposure processing placed on the substrate platform PASS9 (FIG. 8) to the thermal processing unit PHP (FIG. 7) in the upper thermal processing section 303 and the thermal processing unit PHP (FIG. 7) in the lower thermal processing section 304. In these thermal processing units PHP, exposure bake (PEB) is performed.

In the interface block 15, the transport mechanism 146 (FIG. 5) transports the substrate W before the exposure processing placed on the placement/cooling platform P-CP (FIG. 8) to the aligner AL1, AL2 (FIG. 5) in the exposure transport section 200. Further, the transport mechanism 146 (FIG. 5) transports the substrate W after the exposure processing placed on the substrate platform PASS11, PASS12 (FIG. 5) to the substrate platform PASS9 (FIG. 5).

When the exposure transport section 200 cannot receive the substrates W, the substrates W before the exposure processing are temporarily stored in the placement/buffer sections P-BF1, P-BF2. Further, when the development processing unit 139 (FIG. 6) in the second processing block 13 cannot receive the substrates W after the exposure processing, the substrates W after the exposure processing are temporarily stored in the placement/buffer sections P-BF1, P-BF2.

In the present embodiment, the processing for the substrates W in the coating processing chambers 21, 22, the development processing chambers 31, 32 and the upper thermal processing sections 301, 303 provided above, and the processing for the substrates W in the coating processing chambers 23, 24, the development processing chambers 33, 34 and the lower thermal processing sections 302, 304 provided below can be concurrently performed. Thus, it is possible to improve throughput without increasing footprints.

(1-10) Effects

In the substrate processing apparatus 500 according to the present embodiment, the substrates W are transported between the processing section 100 and the plurality of exposure devices EXP via the exposure transport section 200. In the exposure transport section 200, the horizontal transfer region 201 is provided to extend along the plurality of exposure devices EXP, and the substrates W are transported by the transport mechanisms 203a, 203b in the horizontal transport region 201.

In this case, the substrates W before the exposure processing can be sequentially transported from the processing section 100 to the plurality of exposure devices EXP. Further, the substrates W after the exposure processing can be sequentially transported from the plurality of exposure devices EXP to the processing section 100. Therefore, the exposure processing for the substrates W can be concurrently performed in the plurality of exposure devices EXP. Thus, even if a time period required for the exposure processing in each exposure device EXP is lengthened, the plurality of substrates W can be efficiently processed in the substrate processing apparatus 500 and the plurality of exposure devices EXP. Therefore, throughput in a series of substrate processing that includes the exposure processing can be improved.

Further, in the present embodiment, the substrates W are transported between the processing block PB and the exposure transport section 200 via the interface block 15. Thus, the substrates W can be efficiently received and transferred between the processing section 100 and the exposure transport section 200.

Further, in the present embodiment, the transport mechanism 203a is configured to be capable of transporting the substrates W among the substrate platform PASS11, the aligner AL1 and the substrate platforms PASS20 in the plurality of vertical transport regions 202 on the one side, and the transport mechanism 203b is configured to be capable of transporting the substrates W among the substrate platform PASS12, the aligner AL2 and the substrate platforms PASS20 in the plurality of vertical transport regions 202 on the other side. Thus, the substrates W can be smoothly transported between the processing section 100 and the plurality of exposure devices EXP.

Further, in the present embodiment, the plurality of exposure devices EXP are arranged in two rows in the X direction, the substrates W are transported by the transport mechanism 203a between the processing section 100 and the exposure devices EXP in the one row and the substrates W are transported by the transport mechanism 203b between the processing section 100 and the exposure devices EXP in the other row. Thus, transportation of substrates W between the processing section 100 and the exposure devices EXP in the one row and transportation of the substrates W between the processing section 100 and the exposure devices EXP in the other row can be concurrently performed. Further, the exposure processing for the substrates W can be concurrently performed in the exposure devices EXP in the two rows. Thus, throughput in a series of the substrate processing that includes the exposure processing can be further improved.

(2) Second Embodiment

The substrate processing system according to the second embodiment of the present invention will be described below.

Figure 9:
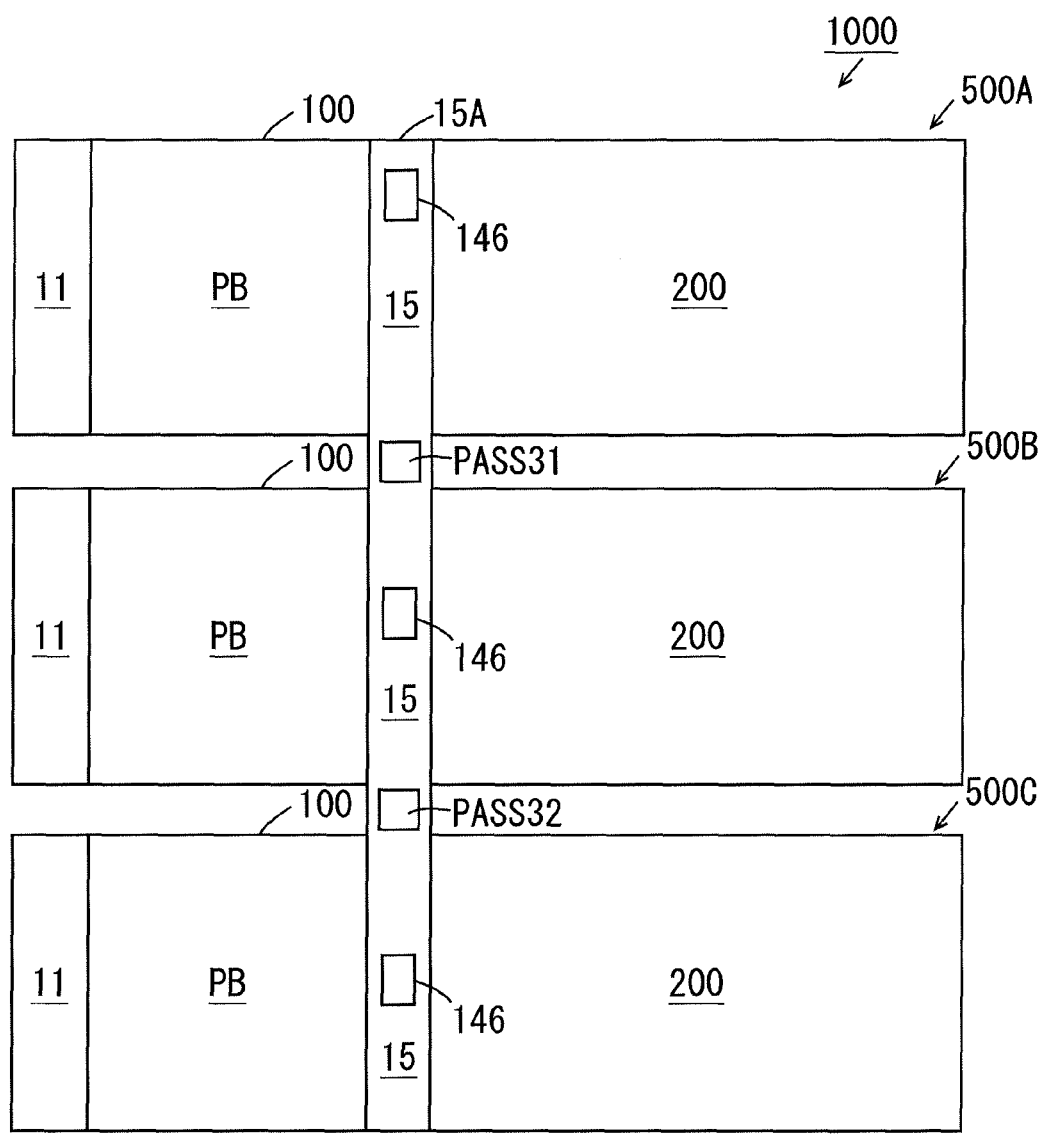
FIG. 9 is a schematic plan view of a substrate processing system according to a second embodiment of the present invention.

FIG. 9 is a schematic plan view of the substrate processing system according to the second embodiment of the present invention. As shown in FIG. 9, the substrate processing system 1000 according to the second embodiment includes the plurality (three in this example) of substrate processing apparatuses 500 arranged in parallel with each other. Hereinafter, the three substrate processing apparatuses 500 of FIG. 9 are referred to as substrate processing apparatuses 500A, 500B, 500C.

Each of the substrate processing apparatuses 500A, 500B, 500C includes the processing section 100 and the exposure transport section 200. The configuration of each exposure transport section 200 is the same as the configuration (see FIGS. 1 to 3) of the exposure transport section 200 in the first embodiment described above. Each processing section 100 includes the indexer block 11, the processing block PB and the interface block 15. The configuration of the indexer block 11 and the processing block PB is the same as the configuration (see FIGS. 5 to 8) of the indexer block 11 and the processing block PB in the first embodiment described above.

In the present embodiment, the interface blocks 15 in the substrate processing apparatuses 500A, 500B, 500C are connected to each other. Thus, a transport path 15A is provided to extend in the Y direction between the exposure transport sections 200 in the substrate processing apparatuses 500A, 500B, 500C and the processing blocks PB in the substrate processing apparatuses 500A, 500B, 500C.

In the transport path 15A, a substrate platform PASS31 is provided between the substrate processing apparatuses 500A, 500B adjacent to each other, and a substrate platform PASS32 is provided between the substrate processing apparatuses 500B, 500C adjacent to each other.

The substrates W are received and transferred between the transport mechanism 146 in the substrate processing apparatus 500A and the transport mechanism 146 in the substrate processing apparatus 500B via the substrate platform PASS31. Further, the substrates W are received and transferred between the transport mechanism 146 in the substrate processing apparatus 500B and the transport mechanism 146 in the substrate processing apparatus 500C via the substrate platform PASS32.

In this substrate processing system 1000, the substrates W can be transported among the substrate processing apparatuses 500A, 500B, 500C via the transport path 15A. Thus, a transport route of the substrates W can be appropriately changed under a variety of situations.

When abnormality occurs in the exposure transport section 200 in the substrate processing apparatus 500A, or when abnormality occurs in the exposure device EXP that corresponds to the substrate processing apparatus 500A, for example, the substrate W before the exposure processing that has been processed in the processing block PB in the substrate processing apparatus 500A is transported to any one of the exposure transport sections 200 in the substrate processing apparatuses 500B, 500C via the transport path 15A. After the exposure processing is performed in the exposure device EXP that corresponds to either one of the substrate processing apparatuses 500B, 500C, the substrate W is returned to the processing block PB in the substrate processing apparatus 500A via the transport path 15A and processing after the exposure processing is performed.

Alternatively, when abnormality occurs in the indexer block 11 or the processing block PB in the substrate processing apparatus 500A, part of the substrates W that has been processed in the processing blocks PB in the substrate processing apparatuses 500B, 500C is transported to the exposure transport section 200 in the substrate processing apparatus 500A via the transport path 15A. After the exposure processing is performed in the exposure device EXP that corresponds to the substrate processing apparatus 500A, the substrate W is returned to the processing block PB in the substrate processing apparatus 500B, 500C via the transport path 15A and the processing after the exposure processing is performed.

In this manner, the substrate processing apparatuses 500A, 500B, 500C can process the substrates W complementarily for one another. Thus, when abnormality occurs in any one of the substrate processing apparatuses 500A, 500B, 500C, it is possible to continue the operation in a normal part without completely stopping the operation of any one of the substrate processing apparatuses. Thus, processing efficiency for the substrates W can be increased.

(3) Third Embodiment

As for the substrate processing system according to the third embodiment of the present invention, difference from the substrate processing system 1000 according to the second embodiment described above will be described below.

FIG. 10 is a schematic plan view of the substrate processing system according to the third embodiment of the present invention. In the substrate processing system 1000 of FIG. 10, each of the substrate processing apparatuses 500A, 500B, 500C includes a carrier buffer section CB arranged to be adjacent to the indexer block 11 in each processing section 100. Further, a transport section 11A is provided to be adjacent to the carrier buffer sections CB in the substrate processing apparatuses 500A, 500B, 500C and to extend in the Y direction. The transport section 11A is made of a conveyor belt, for example, and is configured to be capable of transporting the carriers 113 (FIG. 1) among the plurality of carrier buffer sections CB.

Figure 11:
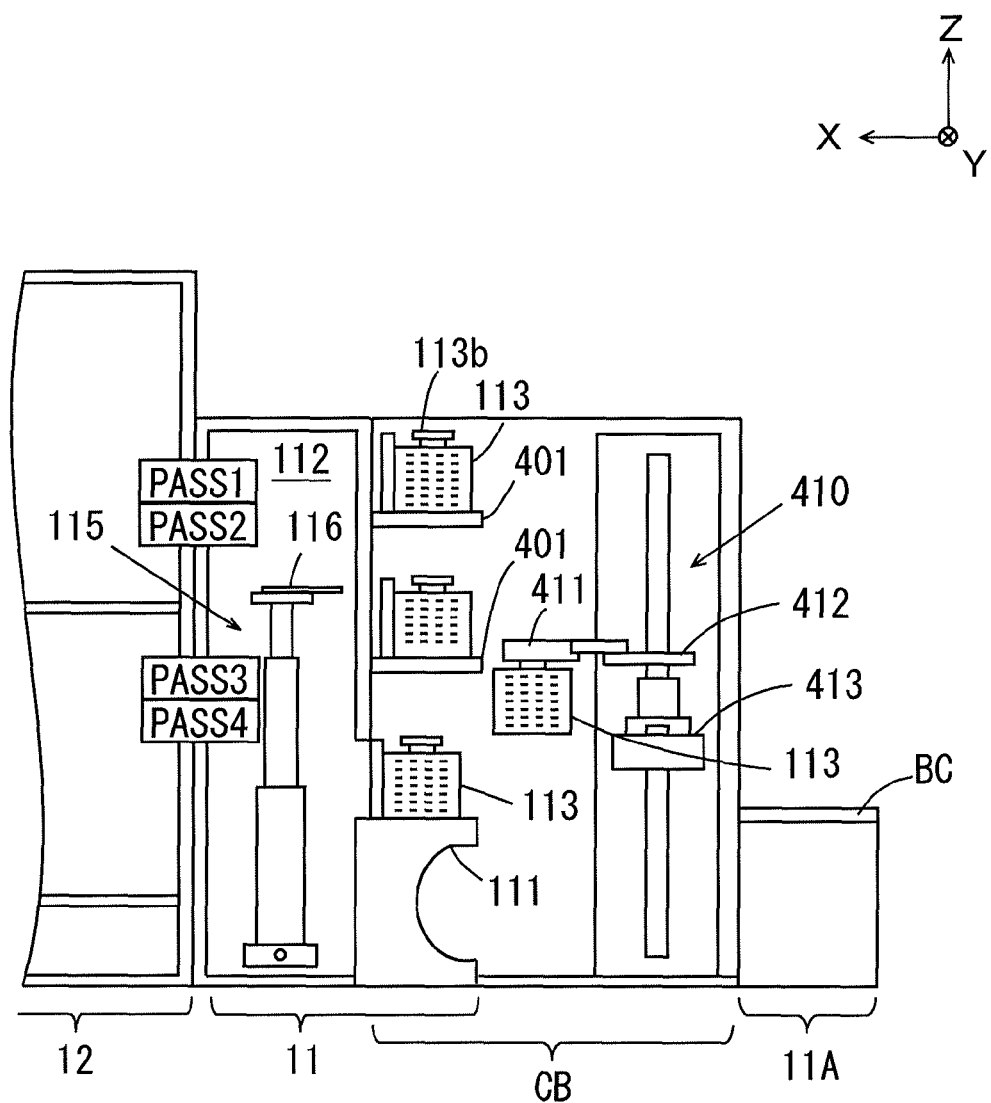
FIG. 11 is a schematic side view showing the configuration of a carrier buffer section and the transport section.

FIG. 11 is a schematic side view showing the configuration of the carrier buffer section CB and the transport section 11A. As shown in FIG. 11, the carrier buffer section CB includes a plurality of shelves 401 and a transport mechanism 410. The plurality of shelves 401 are provided above the plurality of carrier platforms 111. The transport mechanism 410 includes a gripper 411, an arm mechanism 412 and a moving mechanism 413. The gripper 411 and the arm mechanism 412 are integrally moved in the Z direction and the Y direction by the moving mechanism 413. The transport mechanism 410 grips the carrier 113 using the gripper 411, and transports the carriers 113 among the plurality of shelves 401, the plurality of carrier platforms 111 and the transport section 11A. Further, the carrier 113 is transported from a specific shelf 401 to outside and the carrier 113 is transported from the outside to the specified shelf 401 by an outer transport device (not shown). Thus, the carriers 113 in which the unprocessed substrates W are stored can be transported from outside to the carrier platform 111, and the carriers 113 in which the processed substrates W are stored can be transported from the carrier platform 111 to the outside. In this example, a portion to be gripped 113b that can be gripped by the gripper 411 is provided at the upper portion of the carrier 113.

A belt BC is provided at an upper portion of the transport section 11A to be movable in the Y direction. The carrier 113 is placed on the belt BC by the transport device 410 in the carrier buffer section CB. The belt BC is moved in the Y direction by a driving mechanism (not shown). Thus, the carrier 113 placed on the belt BC is transported among the plurality of carrier buffer sections CB.

In the substrate processing system 1000, the substrates W can be transported among the substrate processing apparatuses 500A, 500B, 500C via the transport path 15A and the transport section 11A. Thus, a transport route of the substrates W can be appropriately changed under a variety of situations.

The carrier 113 in which the unprocessed substrates W are stored is carried into the carrier buffer section CB in the substrate processing apparatus 500A from the outside, for example. The substrates W that have been taken out from the carrier 113 are transported to the exposure transport section 200 in the substrate processing apparatus 500A after being processed in the processing section 100 in the substrate processing apparatus 500A. If abnormality occurs in the processing section 100 at this time, the substrates W after the exposure processing cannot be returned from the exposure transport section 200 to the processing section 100.

In this case, the substrates W after the exposure processing are transported from the exposure transport section 200 in the substrate processing apparatus 500A to the processing section 100 in one of the substrate processing apparatuses 500B, 500C via the transport path 15A. Further, the carrier 113 in which these substrates W have been stored is transported from the carrier buffer section CB in the substrate processing apparatus 500A to the carrier buffer section CB in one of the afore-mentioned substrate processing apparatuses 500B, 500C via the transport section 11A. Thereafter, the processing after the exposure processing is performed on the substrates W in the processing section 100 in one of the afore-mentioned substrate processing apparatuses 500B, 500C. The substrates W after the processing are stored in the carrier 113 that has been transported from the carrier buffer section CB in the substrate processing apparatus 500A.

In this manner, when the substrates W after the exposure processing can not be returned to the processing section 100 in any one of the substrate processing apparatuses 500A, 500B, 500C, those substrates W can be returned to the carrier 113 in which the substrates W have been stored before the processing via another substrate processing apparatus. Thus, the plurality of substrates W can be easily managed.

(4) Other Embodiments (4-1)

While the plurality of exposure devices EXP are arranged in two rows in the embodiment described above, the invention is not limited to this. The plurality of exposure devices EXP may be arranged in one row according to a number and a processing speed of the exposure devices EXP. Alternately, the plurality of exposure devices EXP may be arranged in not less than three rows.

(4-2)

While the horizontal transport region 201 is provided above the plurality of exposure devices EXP in the embodiment described above, arrangement of the horizontal transport region 201 is not limited to this. The horizontal transport region 201 may be provided on a side of the plurality of exposure devices EXP, for example.

(4-3)

While the exposure transport section 200 is configured such that the substrate W is transported from the horizontal transport region 201 to each exposure device EXP via the vertical transport region 202 in the embodiment described above, the invention is not limited to this. The exposure transport section 200 may be configured such that the substrate W is directly transported from the horizontal transport region 201 to each exposure device EXP by the transport mechanism 203a, 203b.

(4-4)

While the exposure device EXP that performs direct writing exposure processing by an electron beam is used in the embodiment described above, the invention is not limited to this. The exposure device that performs the exposure processing on the substrates W using another method such as photolithography may be used.

(5) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the embodiments described above, the substrate processing apparatuses 500, 500A, 500B, 500C are examples of a substrate processing apparatus, the exposure device EXP is an example of an exposure device, the processing section 100 is an example of a processing section, the exposure transport section 200 is an example of an exposure transport section, the X direction is an example of one direction, the horizontal transport region 201 is an example of a first transport path, the transport mechanisms 203a, 203b are examples of a first transport mechanism, the processing block PB is an example of a processing region, the interface block 15 is an example of a transport region and the transport mechanism 146 is an example of a second transport mechanism. Further, the substrate platforms PASS11, PASS12 and the aligners AL1, AL2 are examples of a first interface section, the substrate platform PASS20 is an example of a second interface section, the moving rotator 213 is an example of a mover, the aligners AL1, AL2 are examples of an orientation adjustor, the substrate processing system 1000 is an example of a substrate processing system, the transport path 15A or the transport section 11A is an example of transport section between apparatuses and the carrier buffer section CB is an example of a carry-in/carry-out region.

As each of constituent elements recited in the claims, various other elements having configurations or functions described in the claims can be also used.

INDUSTRIAL APPLICABILITY

The present invention can be effectively utilized for processing for various types of substrates.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A substrate processing apparatus provided to be adjacent to a plurality of exposure devices,
the plurality of exposure devices being arranged in one direction relative to one another,
the substrate processing apparatus comprising:
a processing section that performs processing on a substrate; and
an exposure transport section for transporting the substrate between the processing section and the plurality of exposure devices, wherein
the processing section and the exposure transport section are arranged in the one direction relative to each other, and
the exposure transport section includes
a first transport path provided vertically above the plurality of exposure devices to extend in the one direction along the plurality of exposure devices,
a first transport mechanism configured to transport the substrate in the one direction in the first transport path such that the substrate can be received from and transferred to the plurality of exposure devices and the substrate can be received from and transferred to the processing section,
a first interface section, for receiving the substrate from and transferring the substrate to the processing section, provided at one end of the first transport path, and
a plurality of second interface sections, for receiving the substrate from and transferring the substrate to the plurality of exposure devices, arranged along the first transport path,
a plurality of second transport mechanisms that are provided to be vertically movable so as to transport the substrate between the plurality of second interface sections and the plurality of exposure devices, respectively, and
the first transport mechanism includes a mover configured to be movable in the one direction and transporting the substrate between the first interface section and the plurality of second interface sections.

2. The substrate processing apparatus according to claim 1, wherein
the processing section includes
a processing region that performs processing on the substrate, and
a transport region provided between the processing region and the exposure transport section, and
the transport region includes
a second transport mechanism that transports the substrate between the processing region and the exposure transport section.

3. The substrate processing apparatus according to claim 2, wherein the processing region, the transport region, and the exposure transport section are arranged in the one direction relative to one another.

4. The substrate processing apparatus according to claim 1, wherein
the first interface section includes an orientation adjustor for adjusting an orientation of the substrate.

5. The substrate processing apparatus according to claim 1, wherein the plurality of exposure devices are arranged to form a plurality of rows in the one direction, the plurality of first transport paths are provided to respectively extend along the plurality of rows, and the plurality of first transport mechanisms are provided to respectively transport the substrates in the plurality of first transport paths.

6. A substrate processing system, comprising:

the plurality of substrate processing apparatuses according to claim 1, and a transport section between apparatuses for transporting a substrate among the plurality of substrate processing apparatuses.

7. The substrate processing system according to claim 6, wherein the transport section between apparatuses are configured to transport the substrate between the exposure transport sections of the plurality of substrate processing apparatuses and the processing sections of the plurality of substrate processing apparatuses.

8. The substrate processing system according to claim 6, wherein each substrate processing apparatus includes a carry-in/carry-out region for carrying in the substrate from outside and carrying out the substrate to the outside, and the transport section between apparatuses is configured to transport the substrate among the carry-in/carry-out regions in the plurality of substrate processing apparatuses.

9. The substrate processing apparatus according to claim 1, wherein the exposure transport section includes a plurality of up-down transport regions that are provided respectively to be adjacent to the plurality of second interface sections in the one direction, and the plurality of second transport mechanisms are provided respectively to be vertically movable in the plurality of up-down transport regions.

10. The substrate processing apparatus according to claim 9, wherein the mover has a first holder that holds the substrate, the second transport mechanism has a second holder that holds the substrate, the mover is configured to advance and retreat the first holder in a second direction intersecting with the first direction, to place the substrate on each second interface section and receive the substrate from each second interface section, and the second transport mechanism is configured to advance and retreat the second holder in the first direction, to place the substrate on each second interface section and receive the substrate from each second interface section.

\* \* \* \* \*